United States Patent
Shang (10) Patent No.: US 11,783,877 B2
(45) Date of Patent: Oct. 10, 2023

(54) READ-WRITE CONVERSION CIRCUIT AND MEMORY

(71) Applicant: CHANGXIN MEMORY TECHNOLOGIES, INC., Anhui (CN)

(72) Inventor: Weibing Shang, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 94 days.

(21) Appl. No.: 17/445,604

(22) Filed: Aug. 22, 2021

(65) Prior Publication Data

US 2021/0383846 A1 Dec. 9, 2021

Related U.S. Application Data (63) Continuation of application No. PCT/CN2021/074702, filed on Feb. 1, 2021.

(30) Foreign Application Priority Data

Jun. 5, 2020 (CN) .......................... 202010505672.3
Jun. 5, 2020 (CN) .......................... 202021024456.9

(51) Int. Cl.
*G11C 5/14* (2006.01)
*G11C 7/10* (2006.01)
(Continued)

(52) U.S. Cl.
CPC .............. *G11C 7/1096* (2013.01); *G11C 5/14* (2013.01); *G11C 7/06* (2013.01); *G11C 7/109* (2013.01);
(Continued)

(58) Field of Classification Search
CPC ........... G11C 7/1096; G11C 5/14; G11C 7/06; G11C 7/1063; G11C 7/1069; G11C 7/109;
(Continued)

(56) References Cited

U.S. PATENT DOCUMENTS 5,426,755 A  6/1995 Yokouchi
6,212,109 B1 4/2001 Proebsting
(Continued)

FOREIGN PATENT DOCUMENTS

CN  1937072 A   3/2007
CN  103077740 A  5/2013
(Continued)

OTHER PUBLICATIONS

Supplementary European Search Report in the European application No. 21818317.6, dated Sep. 19, 2022.
International Search Report in the international application No. PCT/CN2021/074702, dated May 11, 2021.
(Continued)

*Primary Examiner* — Xiaochun L Chen
(74) *Attorney, Agent, or Firm* — SYNCODA LLC; Feng Ma (57) ABSTRACT

A read-write conversion circuit includes: a read-write conversion module, performing a read-write operation in response to a read-write control signal to implement data transmission between each of a local data line, a local complementary data line, and a global data line, data signals of the local data line and data signals of the local complementary data line being opposite in phase during the read-write operation, and a control module, outputting a variable read-write control signal in response to a read-write speed configuration signal to control a speed of the read-write operation of the read-write conversion module to be variable.

20 Claims, 7 Drawing Sheets

(51) Int. Cl.
  *G11C 7/06* (2006.01)
  *G11C 7/12* (2006.01)
(52) U.S. Cl.
  CPC .......... *G11C 7/1063* (2013.01); *G11C 7/1069* (2013.01); *G11C 7/12* (2013.01)
(58) Field of Classification Search
  CPC .............. G11C 7/12; G11C 2207/2281; G11C 2207/229; G11C 7/1048; G11C 7/22; G11C 11/4076; G11C 11/4096; G11C 11/4094; G11C 16/26; G06F 3/06; G06F 3/061; G06F 3/0658; G06F 2212/1024
  See application file for complete search history.

(56) References Cited

U.S. PATENT DOCUMENTS

| | | | |
|---|---|---|---|
| 6,317,374 | B2 | 11/2001 | Feurle |
| 6,359,803 | B1 | 3/2002 | Tanaka |
| 6,636,453 | B2 | 10/2003 | Fischer |
| 7,203,102 | B2 | 4/2007 | Brox |
| 7,227,799 | B2 | 6/2007 | Vogelsang |
| 7,289,385 | B2 | 10/2007 | Kwak |
| 7,808,853 | B2 | 10/2010 | Berthel |
| 2010/0327923 | A1 | 12/2010 | Pyeon |
| 2013/0318287 | A1 | 11/2013 | Pyeon et al. |
| 2014/0036610 | A1* | 2/2014 | Ramamurthy ........ G11C 11/419 365/203 |

FOREIGN PATENT DOCUMENTS

| | | |
|---|---|---|
| CN | 110827891 A | 2/2020 |
| CN | 110867203 A | 3/2020 |
| CN | 212032138 U | 11/2020 |
| JP | H05189976 A | 7/1993 |
| JP | 2004158050 A | 6/2004 |
| JP | 2012531635 A | 12/2012 |
| KR | 930006724 A | 4/1993 |

OTHER PUBLICATIONS

Jinyeong Moon and Byongtae Chung, "Sense Amplifier with Offset Mismatch Calibration for Sub 1-V DRAM Core Operation" IEEE International Symposium on Circuits & Systems, 2010.

Shunichi Suzuki and Masaki Hirata, "Threshold Difference Compensated Sense Amplifier" IEEE Journal of Solid-State Circuits, vol. SC-14, No. 6, Dec. 1979.

First Office Action of the Japanese application No. 2022-538927, dated May 16, 2023. 7 pages with English translation.

* cited by examiner

READ-WRITE CONVERSION CIRCUIT AND MEMORY

CROSS-REFERENCE TO RELATED APPLICATIONS

This is a continuation of International Patent Application No. PCT/CN2021/074702, filed on Feb. 1, 2021, which claims priority to Chinese Patent Application No. 202010505672.3 filed on Jun. 5, 2020, and to Chinese Patent Application No. 202021024456.9 filed on Jun. 5, 2020. The disclosures of these applications are hereby incorporated by reference in their entireties.

BACKGROUND

Dynamic Random Access Memory (DRAM) is a semiconductor storage device often used in computers, and is composed of many repetitive storage units. Each storage unit usually includes a capacitor and a transistor. A gate of the transistor is connected with a word line, a drain is connected with a bit line, and a source is connected with the capacitor. A voltage signal on the word line can control the transistor to be turned on or turned off to further read data information stored in the capacitor through the bit line or write data information in the capacitor for storage through the bit line.

SUMMARY

Embodiments of the disclosure relate to the technical field of semiconductors, and more specifically to a read-write conversion circuit and a memory.

Some embodiments of the disclosure are intended to provide a read-write conversion circuit and a memory as a solution to the technical problem. The read-write operation speed of the read-write conversion circuit is variable, so that the performance of the memory is improved.

Various embodiments of the disclosure provide a read-write conversion circuit, which is characterized by that the circuit includes: a read-write conversion module, performing a read-write operation in response to a read-write control signal; and a control module, outputting a variable read-write control signal in response to a read-write speed configuration signal to control the speed of the read-write operation of the read-write conversion module to be variable.

In some embodiments, a speed configuration module may further be included, which may be connected with the control module and configured to output the read-write speed configuration signal to the control module.

In some embodiments, the read-write control signal may include a read control signal and a write control signal. The read-write conversion module may perform a read operation in response to the read control signal, and perform a write operation in response to the write control signal. The speed configuration module may include: a read speed configuration unit, configured to output a read speed configuration signal in the read-write speed configuration signal to the control module, which causes the control module to output the variable read control signal in response to the read speed configuration signal, controlling the speed of the read operation to be variable. The speed configuration module may also include a write speed configuration unit, configured to output a write speed configuration signal in the read-write speed configuration signal to the control module to cause the control module to output the variable write control signal in response to the read speed configuration signal to control a speed of the write operation to be variable.

In some embodiments, a local data line, a local complementary data line, and a global data line may further be included. During the read-write operation, data transmission may be performed between each of the local data line, the local complementary data line, and the global data line, in which the data signals of the local data line and the local complementary data line may be opposite in phase.

In some embodiments, the read-write conversion module may include a local read-write unit, performing a local read-write operation in response to a local read-write control signal in the read-write control signal. The control module may include a local control unit, outputting the variable local read-write control signal in response to a local read-write speed configuration signal in the read-write speed configuration signal, in order to control the speed of the local read-write operation of the local read-write unit to be variable.

In some embodiments, the read-write conversion circuit may further include a local speed configuration module, connected with the local control unit and configured to output the local read-write speed configuration signal to the local control unit.

In some embodiments, the read-write conversion circuit may further include a sense amplifier, connected with the local read-write unit through the local data line and the local complementary data line, and configured to sense the voltage of the bit line.

In some embodiments, the same local read-write unit may be connected with multiple sense amplifiers through the local data line and the local complementary data line.

In some embodiments, a write data path may be as follows: from the local read-write unit to the sense amplifier via the local data line and the local complementary data line, and then to the bit line via the sense amplifier. A read data path may be as follows: from the bit line to the local data line and the local complementary data line via the sense amplifier, and then to the local read-write unit via the local data line and the local complementary data line.

In some embodiments, the read-write conversion module may include a global read-write unit, performing a global read-write operation in response to a global read-write control signal in the read-write control signal. The control module may include a global control unit, outputting the variable global read-write control signal in response to a global read-write speed configuration signal in the read-write speed configuration signal to control a speed of the global read-write operation of the global read-write unit to be variable.

In some embodiments, the read-write conversion circuit may further include a global speed configuration module, connected with the global control unit and configured to output the global read-write speed configuration signal to the global control unit.

In some embodiments, the local read-write unit may include a local amplifier, connected between the local data line and the local complementary data line and configured to amplify the data of the local data line and the data of the local complementary data line.

In some embodiments, the local amplifier may include: a first phase inverter, a first input end of the first phase inverter being electrically connected with the local data line, and a first output end of the first phase inverter being electrically connected with the local complementary data line; and a second phase inverter, a second input terminal of the second phase inverter being electrically connected with the first output terminal of the first phase inverter and the local complementary data line, and a second output terminal of the second phase inverter being electrically connected with the first input terminal of the first phase inverter and the local data line.

In some embodiments, the first phase inverter may include a first P-channel Metal Oxide Semiconductor (PMOS) transistor and a first N-channel Metal Oxide Semiconductor (NMOS) transistor. A gate of the first PMOS transistor may be connected with a gate of the first NMOS transistor to serve as the first input terminal of the first phase inverter, a source of the first PMOS transistor may be connected with a power supply, and a drain of the first PMOS transistor may be connected with a drain of the first NMOS transistor to serve as the first output terminal of the first phase inverter. The second phase inverter may include a zeroth PMOS transistor and a zeroth NMOS transistor. A gate of the zeroth PMOS transistor may be connected with a gate of the zeroth NMOS transistor to serve as the second input terminal of the second phase inverter. A source of the zeroth PMOS transistor may be connected with the power supply, and a drain of the zeroth PMOS transistor may be connected with a drain of the zeroth NMOS transistor to serve as the second output terminal of the second phase inverter.

In some embodiments, the local read-write unit may include a local read conversion circuit, configured to transmit the data of the local data line and the local complementary data line to the global data line in response to a local read control signal in the local read-write control signal. The local read conversion circuit may include a third NMOS transistor and a fourth NMOS transistor. A drain of the third NMOS transistor may be connected with the global data line, a gate of the third NMOS transistor may be connected with the local complementary data line, and a source of the third NMOS transistor may be connected with a drain of the fourth NMOS transistor. A gate of the fourth NMOS transistor may receive a local read signal in the local read control signal, while a source may be grounded.

In some embodiments, the read-write conversion circuit may further include a global complementary data line, and during the read operation, data signals of the global complementary data line and the global data line may be opposite in phase. The local read conversion circuit may further include an eighth NMOS transistor and a ninth NMOS transistor. A drain of the eighth NMOS transistor may be connected with the global complementary data line, a gate of the eighth NMOS transistor may be connected with the local data line, and a source of the eighth NMOS transistor may be connected with a drain of the ninth NMOS transistor. A gate of the ninth NMOS transistor may receive the local read signal, while a source may be grounded.

In some embodiments, the local read-write unit may include a local write conversion circuit, configured to transmit data of the global data line to the local data line and the local complementary data line in response to a local write control signal in the local read-write control signal. The local write conversion circuit may include a fifth NMOS transistor, a sixth NMOS transistor, and a seventh NMOS transistor. A drain of the fifth NMOS transistor may be connected with the local complementary data line, a gate of the fifth NMOS transistor may be connected with a source of the seventh NMOS transistor, and a source of the fifth NMOS transistor may be connected with a drain of the sixth NMOS transistor. A gate of the sixth NMOS transistor may receive a local write signal in the local write control signal, while a source may be grounded. A drain of the seventh NMOS transistor may be connected with the local data line, while a gate may receive the local write signal.

In some embodiments, the read-write conversion circuit may further include the global complementary data line, and during the read-write operation, the data signals of the global complementary data line and the global data line may be opposite in phase. The local write conversion circuit may further include a tenth NMOS transistor, an eleventh NMOS transistor, and a twelfth NMOS transistor. A drain of the tenth NMOS transistor may be connected with the local data line, a gate of the tenth NMOS transistor may be connected with a source of the twelfth NMOS transistor and the global complementary data line, and a source of the tenth NMOS transistor may be connected with a drain of the eleventh NMOS transistor. A gate of the eleventh NMOS transistor may receive the local write signal, while a source may be grounded. A drain of the twelfth NMOS transistor may be connected with the local complementary data line, while a gate may receive the local write signal.

In some embodiments, the local read-write unit may further include a precharging circuit, connected between the local data line and the local complementary data line and configured to precharge the local data line and the local complementary data line in response to a precharging control signal.

In some embodiments, the precharging circuit may include a third PMOS transistor, a fourth PMOS transistor, and a fifth PMOS transistor. A gate of the third PMOS transistor, a gate of the fourth PMOS transistor, and a gate of the fifth PMOS transistor may receive the precharging control signal. A source of the third PMOS transistor and a source of the fourth PMOS transistor may be connected with a power supply. A drain of the third PMOS transistor may be electrically connected with the local data line. A drain of the fourth PMOS transistor may be electrically connected with the local complementary data line. The fifth PMOS transistor may be electrically connected with the local data line and the local complementary data line in response to the precharging control signal.

Correspondingly, the embodiments of the disclosure also provide a memory, which may include the abovementioned read-write conversion circuit.

Compared with a related art, the technical solutions provided in the embodiments of the disclosure have the following advantages.

The embodiments of the disclosure provide the read-write conversion circuit with high structural performance, which includes the read-write conversion module that performs the read-write operation in response to the read-write control signal and a control module that outputs the variable read-write control signal in response to the read-write speed configuration signal, so that the speed of the read-write operation of the read-write conversion module remains variable. Since the read-write control signal output by the control module is variable, the speed of the read-write operation performed by the read-write conversion module after receiving the variable read-write control signal is also variable, and the speed of the read-write operation of the read-write conversion circuit can therefore be configured. Compared with the related art where the speed of the read-write operation of the read-write conversion circuit is fixed, the read-write conversion circuit provided in the embodiments of the disclosure may adjust the speed of the read-write operation as practically required, so that the read-write conversion circuit may be applied more extensively, not only to a low-speed read-write operation but also to a high-speed read-write operation, for example. In some embodiments, with the adoption of the read-write conversion circuit provided in the embodiments of the disclosure, the high-speed read-write operation may be adjusted to the low-speed read-write operation when not required, so that the problem of high power consumption caused by the high-speed read-write operation is resolved. Therefore, the performance of the read-write conversion circuit provided in the embodiments of the disclosure may be improved.

In some embodiments, the read-write conversion module includes the local read-write unit, and the control module includes the local control unit, outputting the variable local read-write control signal in response to the local read-write speed configuration signal in the read-write speed configuration signal so that the speed of the local read-write operation of the local read-write unit remains variable. Therefore, the speed of the local read-write operation of the read-write conversion circuit provided in the embodiments of the disclosure may be configured.

In some embodiments, the read-write conversion module includes the global read-write unit, and the control module includes the global control unit, outputting the variable global read-write control signal in response to the global read-write speed configuration signal in the read-write speed configuration signal so that the speed of the global read-write operation of the global read-write unit remains variable. Therefore, the speed of the global read-write operation of the read-write conversion circuit provided in the embodiments of the disclosure may be configured.

In some embodiments, the local read-write unit includes the local amplifier, connected between the local data line and the local complementary data line and configured to amplify the data of the local data line and the data of the local complementary data line. The local amplifier is favorable for accelerating the distinction between the local data line and the local complementary data line, and is favorable not only for increasing the speed of the local read-write operation but also for reducing the drive requirement of the local data line and the local complementary data line on the sense amplifier, thereby reducing the difficulty of designing sense amplifiers.

DETAILED DESCRIPTION

DRAM includes Double Data Rate (DDR) DRAM, Graphics Double Data Rate (GDDR) DRAM, and Low Power Double Data Rate (LPDDR) DRAM. With the application of the DRAM to more fields, for example, the increasing application of the DRAM to the mobile fields, user expectations for the speed index of the DRAM have increased.

The performance of a DRAM can be improved according to some embodiments of the present disclosure.

In a possible embodiment, for a same DRAM, a speed (including a read speed and a write speed) of a read-write operation thereof is fixed. Since of the speed of the read-write operation of the DRAM is fixed, if the DRAM is designed to have a fixed low read-write operation speed, it is difficult to meet the demand of the DRAM on a high read-write operation speed in some periods. On the other hand, if the DRAM is designed to have a fixed high read-write operation speed, then for the periods where the DRAM has low speeds of read-write operations, the fixed high read-write speed of the DRAM will cause an energy consumption issue. That is, at present, the memory faces a problem of fixed read-write operation speed and high power consumption.

In order to solve the foregoing problem, the embodiments of the disclosure provide a read-write conversion circuit, which includes a read-write conversion module and a control module. The control module outputs a variable read-write control signal in response to a read-write speed configuration signal to control a speed of a read-write operation of the read-write conversion module to be variable. Therefore, according to the embodiments of the disclosure, the speed of the read-write operation may be configured to adjust the speed of the read-write operation of the read-write conversion circuit to an expected speed, avoiding unnecessary power consumption of the read-write conversion circuit and improving the performance of the read-write conversion circuit.

To make the objectives, technical solutions, and advantages of the embodiments of the disclosure clearer, each embodiment of the disclosure will be described below in detail in combination with the drawings. However, those of ordinary skill in the art can note that, in each embodiment of the disclosure, many technical details are proposed to make readers understand the disclosure better. However, the technical solutions claimed by the disclosure may also be implemented even without these technical details, variations, and modifications as explained in each of the following embodiments.

Figure 1:
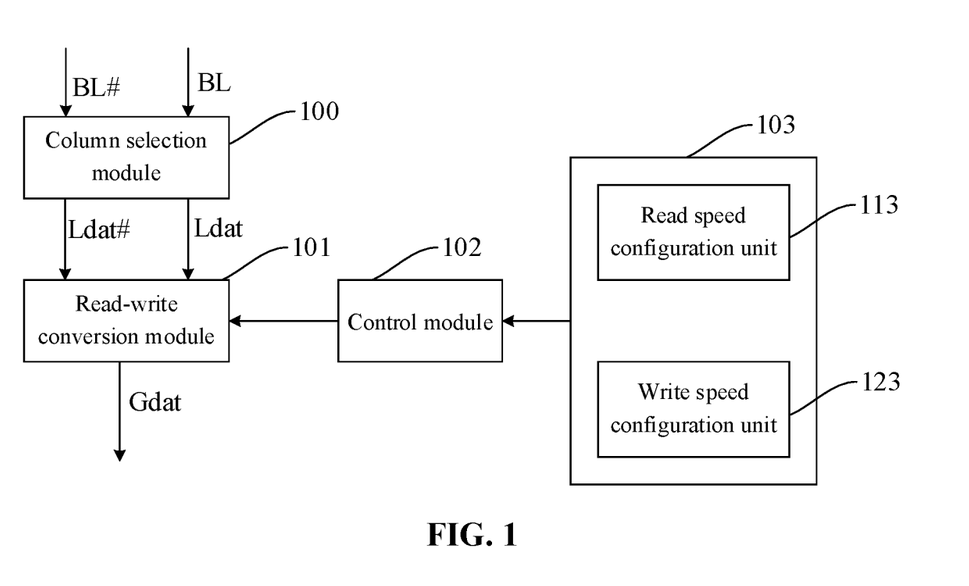
FIG. 1 is a schematic diagram of a read-write conversion circuit according to an embodiment of the disclosure.

FIG. 1 is a schematic diagram of a read-write conversion circuit according to an embodiment of the disclosure.

Referring to FIG. 1, in the embodiment, the read-write conversion circuit includes: a read-write conversion module 101, performing a read-write operation in response to a read-write control signal; and a control module 102, outputting a variable read-write control signal in response to a read-write speed configuration signal to control a speed of the read-write operation of the read-write conversion module 101 to be variable.

The read-write conversion circuit provided in the embodiment will be described below in detail in combination with the drawings.

In the embodiment, the read-write conversion circuit may further include a local data line Ldat, a local complementary data line Ldat#, and a global data line Gdat. During the read-write operation, data transmission is performed between each of the local data line Ldat, the local complementary data line Ldat#, and the global data line Gdat, where the data signal of the local data line Ldat and the data signal of the local complementary data line Ldat# are opposite in phase.

In the embodiment, data signals read or written by the read-write conversion circuit are paired. Each pair of data signals include two pieces of data. In a read-write operation process, one of the two pieces of data is a high-level signal, while the other piece of data is a low-level signal. Therefore, the read-write conversion circuit includes at least one pair of local data line Ldat and local complementary data line Ldat#, and the two pieces of data are the data of the local data line Ldat and the data of the local complementary data line Ldat#, respectively. Specifically, during a read operation of the read-write conversion circuit, data is transmitted from the local data line Ldat and the local complementary data line Ldat# to the global data line Gdat; and during a write operation of the read-write conversion circuit, data is transmitted from the global data line Gdat to the local data line Ldat and the local complementary data line Ldat#.

The local data line Ldat is also called a local data line, the local complementary data line Ldat# is also called a local complementary data line, and the global data line Gdat is also called a global data line.

In the embodiment, a single-end transmission manner is used for the global data line Gdat of the read-write conversion circuit, namely no global complementary data line complementary with the global data line Gdat in data signal phase is arranged in the read-write conversion circuit.

It is to be noted that, in another embodiment, a double-end transmission manner may also be used for the global data line of the read-write conversion circuit, namely the read-write conversion circuit may further include a global complementary data line, and during the read-write operation, the data signal of the global complementary data line and the data signal of the global data line are opposite in phase.

In a specific embodiment, the read-write conversion circuit is applied to a memory. The memory includes a column selection module 100 and multiple storage units. The local data line Ldat is connected with a bit line BL through the column selection module 100, and the local complementary data line Ldat# is connected with a complementary bit line BL# through the column selection module 100. The storage unit for the read operation or the write operation is selected through the column selection module 100. Correspondingly, signals are transmitted between the bit line BL connected with the selected storage unit and the local data line Ldat, and signals are transmitted between the complementary bit line BL# connected with the selected storage unit and the local complementary data line Ldat#.

During the read operation, the read-write conversion module 101 transmits the data of the local data line Ldat and the data of the local complementary data line Ldat# to the global data line Gdat; and during the write operation, the read-write conversion module 101 transmits data of the global data line Gdat to the local data line Ldat and the local complementary data line Ldat#.

The read-write control signal includes a column selection signal, a local read-write control signal, and a global read-write control signal. The local read-write control signal is configured to control the read-write conversion module 101 to perform a local read-write operation. The global read-write control signal is configured to control the read-write conversion module 101 to perform a global read-write operation.

The rate of the read-write control signal influences the speed of the read-write operation of the read-write conversion circuit. For example, if the rate of the read-write control signal is higher, the speed of the read-write operation is correspondingly higher; and if the rate of the read-write control signal is lower, the speed of the read-write operation is correspondingly lower.

The read-write control signal is provided by the control module 102, and the read-write control signal output by the control module 102 is variable, specifically, the rate of the read-write control signal is variable. The read-write speed configuration signal is related to an expected speed of the read-write operation. When the speed of the read-write operation is not the expected speed, the read-write control signal output by the control module 102 changes. That is, the rate of the read-write control signal changes, which changes the speed of the read-write operation performed by the read-write conversion module 101 in response to the changed read-write control signal, therefore ensuring that the read-write speed of the read-write operation is the expected speed.

In a specific embodiment, when the speed of a read-write operation performed by the read-write conversion module 101 in response to a first read-write control signal is lower than the expected speed, the control module 102 outputs a second read-write control signal in response to the read-write speed configuration signal to increase the speed of the read-write operation of the read-write conversion module 101 to the expected speed. When a speed of a read-write operation performed by the read-write conversion module 101 in response to a third read-write control signal is higher than the expected speed, the control module 102 outputs a fourth read-write control signal in response to the read-write speed configuration signal to decrease the speed of the read-write operation of the read-write conversion module 101 to the expected speed.

Since the speed of the read-write operation of the read-write conversion module 101 is variable, the speed of the read-write operation of the read-write conversion module 101 may be adjusted according to a practical performance requirement. For example, an increase or decrease in the speed of data transmission in the read-write operation can be used to meet different read-write performance requirements and reduce unnecessary power consumption as well.

In the embodiment, the read-write conversion circuit may further include a speed configuration module 103, connected with the control module 102 and configured to output a read-write speed configuration signal to the control module 102. In such a manner, the speed configuration module 103 is integrated into the read-write conversion circuit to help to shorten the transmission path for transmitting the read-write speed configuration signal to the control module 102 and to accelerate a response speed of the control module 102 for a more timely output of the adjusted read-write control signal so that changing the speed of the read-write operation of the read-write conversion module 101 may be achieved more rapidly.

The read-write control signal includes a read control signal and a write control signal. The read-write conversion module 101 performs the read operation in response to the read control signal, and performs the write operation in response to the write control signal. In the embodiment, the control module 102 outputs a variable read control signal in response to the read-write speed configuration signal to control the speed of the read operation of the read-write conversion module 101 to be variable. The control module 102 also outputs a variable write control signal in response to the read-write speed configuration signal to control the speed of the write operation of the read-write conversion module 101 to be variable.

Correspondingly, the read-write speed configuration signal includes a read speed configuration signal and a write speed configuration signal. The speed configuration module 103 includes: a read speed configuration unit 113, configured to output a read speed configuration signal in the read-write speed configuration signal to the control module 102, which then outputs a variable read control signal in response to the read speed configuration signal to control the speed of the read operation to be variable; and a write speed configuration unit 123, configured to output a write speed configuration signal in the read-write speed configuration signal to the control module 102, which then outputs a variable write control signal in response to the read speed configuration signal to control the speed of the write operation to be variable.

It is to be noted that the speed configuration module may further include a local speed configuration module and a global speed configuration module. The local speed configuration module is configured to output a local read speed configuration signal to the control module to control a speed of the local read-write operation of the read-write conversion module to be variable. The global speed configuration module is configured to output a global read-write speed configuration signal to the control module to control a speed of the global read-write operation of the read-write conversion module to be variable.

It is also to be noted that, in another embodiment, the speed configuration module may also be provided by another circuit except the read-write conversion circuit.

According to the read-write conversion circuit provided in the embodiment, the control module 102 outputs the variable read-write control signal to make variable the speed of the read-write operation of the read-write conversion module 101. This allows for the read-write conversion circuit to be applied to more scenarios, for example, applied not only to a high-speed read-write operation but also to a low-speed read-write operation. Moreover, it resolves the problem of high power consumption caused by a sustained high-speed read-write operation state.

Another embodiment of the disclosure also provides a read-write conversion circuit. The read-write conversion circuit is substantially the same as the read-write conversion circuit provided in the previous embodiment. The difference is that the read-write conversion module and the control module are described in more detail in the embodiment. The read-write conversion circuit provided in the embodiment will be described below in detail in combination with the drawings. For the same or corresponding parts as the previous embodiment, one may refer to the detailed descriptions provided in the previous embodiment.

Figure 2:
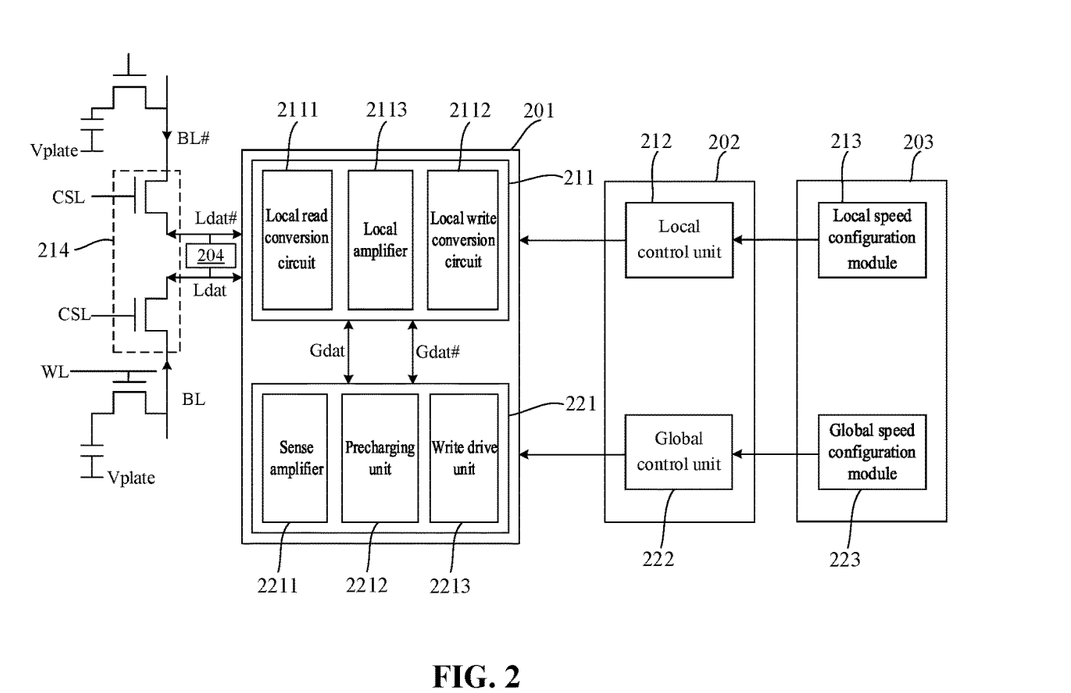
FIG. 2 is a schematic diagram of a read-write conversion circuit according to another embodiment of the disclosure.

FIG. 2 shows a read-write conversion circuit according to another embodiment of the disclosure.

Referring to FIG. 2, the read-write conversion circuit includes a local data line Ldat, a local complementary data line Ldat#, a global data line Gdat, a global complementary data line Gdat#, a read-write conversion module 201, and a control module 202. The read-write conversion module 201 performs a read-write operation in response to a read-write control signal to implement data transmission between each of the local data line Ldat and the local complementary data line Ldat#, and each of the global data line Gdat and the global complementary data line Gdat#. During the read-write operation, the data signals of the local data line Ldat and the local complementary data line Ldat# are opposite in phase, and the data signals of the global data line Gdat and the global complementary data line Gdat# are opposite in phase.

It is to be noted that, in another embodiment, the read-write conversion circuit may be provided with no global complementary data line, or provided only with the global data line. For more specifics, please make reference to the previous embodiment.

In the embodiment, the read-write conversion module 201 includes a local read-write unit 211, performing a local read-write operation in response to a local read-write control signal in the read-write control signal. The local read-write control signal includes a local read signal Rd and a local amplification enable signal.

Correspondingly, the control module 202 includes a local control unit 212, outputting the variable local read-write control signal in response to a local read-write speed configuration signal in a read-write speed configuration signal to control the speed of the local read-write operation in the local read-write unit 211 to be variable.

In such a manner, the speed of the local read-write operation in the read-write conversion circuit is variable. Specifically, the speed of a local read operation in the local read-write operation is variable, and the speed of a local write operation in the local read-write operation is also variable. For example, the local read operation may be changed from a high-speed read to a low-speed read, or, changed from a low-speed read to a high-speed read. The local write operation may be changed from a high-speed write to a low-speed write, or, changed from a low-speed write to a high-speed write. Since the speed of the local read-write operation is variable, the speed of the local read-write operation may be adjusted as practically necessary to meet the demands on the data transmission speed and simultaneously to ensure the advantage of low power consumption of the read-write conversion circuit.

In the embodiment, the read-write conversion circuit may further include a local speed configuration module 213, connected with the local control unit 212 and configured to output the local read-write speed configuration signal to the local control unit 212, so that the local read-write control signal output by the local control unit 212 is made adjustable.

It is to be noted that, in another embodiment, the local read-write speed configuration signal may also be provided for the local control unit by an external circuit, that is, the read-write conversion circuit does not need the local speed configuration module.

The read-write conversion circuit may further include a sense amplifier 214. The sense amplifier 214 is connected with the local read-write unit 211 through the local data line Ldat and the local complementary data line Ldat#, and is configured to sense voltages of the bit line BL and the complementary bit line BL#.

The bit line BL is connected with the local data line Ldat through the sense amplifier 214, and the complementary bit line BL# is connected with the local complementary data line Ldat# through the sense amplifier 214.

In the embodiment, the sense amplifier 214 receives a column selection signal CSL. The sense amplifier 214 includes two NMOS transistors (not marked), and gates of the NMOS transistors receive the column selection signal CSL. One NMOS transistor is connected with the bit line BL and the local data line Ldat in response to the column selection signal CSL, while the other NMOS transistor is connected with the complementary bit line BL# and the local complementary data line Ldat# in response to the column selection signal CSL. Specifically, when the NMOS transistor receives the column selection signal CSL and is turned on, the bit line BL is connected with the local data line Ldat, and the complementary bit line BL# is connected with the local complementary data line Ldat#. When the NMOS transistor stops receiving the column selection signal CSL, the bit line BL is disconnected from the local data line Ldat, and the complementary bit line BL# is disconnected from the local complementary data line Ldat#.

It can be understood that, in another embodiment, the sense amplifier may include any number of transistors, for example, multiple NMOS transistors and/or multiple PMOS transistors. Any device capable of realizing a sense amplifier function may be used as the sense amplifier.

The bit line BL is connected with a memory transistor (not marked). A gate of the memory transistor is connected with a word line WL. One end of the memory transistor is connected with the bit line BL, while the other end is connected with a voltage Vplate through a capacitor (not marked). The complementary bit line BL# is connected with a control transistor (not marked). One end of the control transistor is connected with the complementary bit line BL#, while the other end is connected with the voltage Vplate.

In some embodiments, the same local read-write unit 211 may be connected with multiple sense amplifiers 214 through the local data line Ldat and the local complementary data line Ldat#. For convenient illustration and description, FIG. 2 shows only one sense amplifier 214.

In the embodiment, the read-write conversion circuit is applied to a memory. A write data path goes from the local read-write unit 211 to the sense amplifier via the local data line Ldat and via the local complementary data line Ldat#, and then to the bit line BL and the complementary bit line BL# via the sense amplifier 214. A read data path goes from the bit line to the local data line Ldat and to the local complementary data line Ldat# via the sense amplifier 214, and then to the local read-write unit 211 via the local data line Ldat and via the local complementary data line Ldat#.

In the embodiment, the read-write conversion module 201 further includes a global read-write unit 221, performing a global read-write operation in response to a global read-write control signal in the read-write control signal.

The control module 202 includes a global control unit 222, outputting the variable global read-write control signal in response to a global read-write speed configuration signal in the read-write speed configuration signal, in order to maintain a variable speed of the global read-write operation in the global read-write unit 221. In such a manner, the speed of the global read-write operation in the read-write conversion circuit is variable. Specifically, the speed of a global read operation in the global read-write operation is variable, and the speed of a global write operation in the global read-write operation is variable.

That is, in the embodiment, not only is the speed of the local read-write operation variable, but also the speed of the global read-write operation is variable.

It is to be noted that, in another embodiment, the control module may include only one of the local control unit or the global control unit, and correspondingly, only the speed of the local read-write operation is variable or only the speed of the global read-write operation is variable.

Correspondingly, the read-write conversion circuit may further include a global speed configuration module 223, connected with the global control unit 222 and configured to output the global read-write speed configuration signal to the global control unit 222.

The local speed configuration module 213 and the global speed configuration module 223 may be integrated into the same speed configuration module 203. The speed configuration module 203 is configured to output the local read-write speed configuration signal to the local control unit 212, and is further configured to output the global read-write speed configuration signal to the global control unit 222.

It can be understood that, in another embodiment, the global read-write speed configuration signal may also be provided for the global control unit by an external circuit, that is, the read-write conversion circuit does not need the global speed configuration module.

Figure 3:
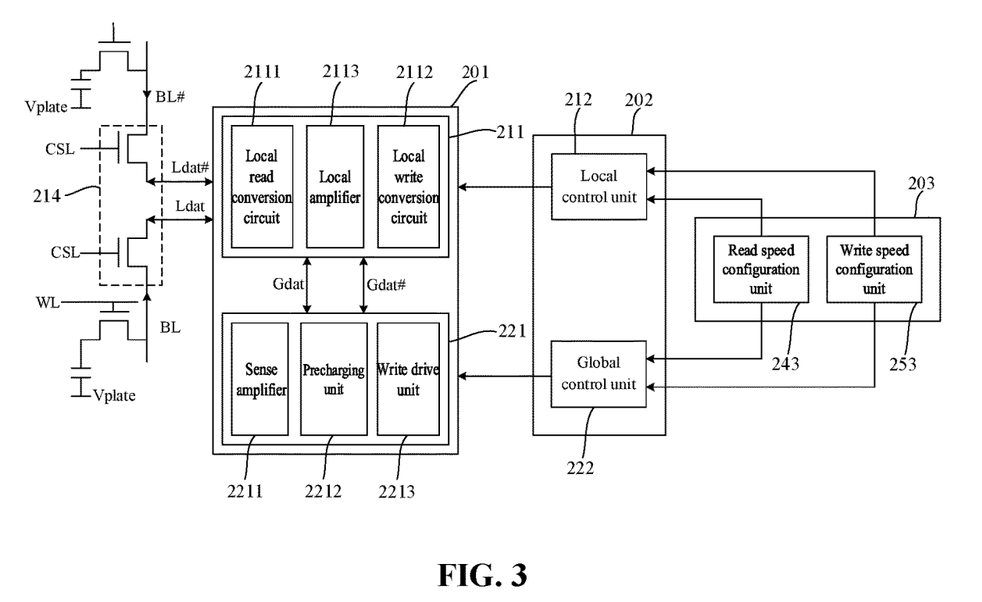
FIG. 3 is a schematic diagram of another read-write conversion circuit according to another embodiment of the disclosure.

FIG. 3 shows another read-write conversion circuit according to another embodiment. As shown in FIG. 3, in another example, the read-write conversion circuit may further include a read speed configuration unit 243, configured to output a read speed configuration signal in the read-write speed configuration signal to the local control unit 212 and the global control unit 222. This causes the local control unit 212 to output a variable local read control signal in response to the read speed configuration signal to control the speed of the local read operation to be variable. In addition, this causes the global control unit 222 to output a variable global read control signal in response to the read speed configuration signal to control the speed of the global read operation to be variable. The read-write conversion circuit may further include a write speed configuration unit 253, configured to output a write speed configuration signal in the read-write speed configuration signal to the local control unit 212 and the global control unit 222, causing the local control unit 212 to output a variable local write control signal in response to the write speed configuration signal to control the speed of the local write operation to be variable. This causes the global control unit 222 to output a variable global write control signal in response to the write speed configuration signal to control the speed of the global write operation to be variable. The read speed configuration unit 243 and the write speed configuration unit 253 may be integrated into the same speed configuration module 203. Descriptions about the speed configuration module 203 may be obtained by reference to the aforementioned embodiment.

For the read-write conversion circuit with the global read-write unit 221, the write data path goes to the global data line Gdat and the global complementary data line Gdat# via the global read-write unit 221, then to the local read-write unit 211 via the global data line Gdat and the global complementary data line Gdat#, from the local read-write unit 211 to the sense amplifier 214 via the local data line Ldat and the local complementary data line Ldat#, and then to the bit line BL and the complementary bit line BL# via the sense amplifier 214.

For the read-write conversion circuit with the global read-write unit 221, the read data path goes from the bit line BL and the complementary bit line BL# to the local data line Ldat and the local complementary data line Ldat# via the sense amplifier 214, then to the local read-write unit 211 via the local data line Ldat and the local complementary data line Ldat#, then to the global data line Gdat and the global complementary data line Gdat# via the local read-write unit 211, and finally to the global read-write unit 221 via the global data line Gdat and the global complementary data line Gdat#.

Referring to FIG. 2 and FIG. 3, in the embodiment, the local read-write unit 211 includes a local read conversion circuit 2111 that is configured to transmit data of the local data line Ldat and the local complementary data line Ldat# to the global data line Gdat and the global complementary data line Gdat# in response to the local read control signal in the local read-write control signal.

The control module 202 outputs the local read control signal and the variable local read control signal in response to the read-write speed configuration signal to adjust the read speed of the local read conversion circuit 2111, making the speed of the local read operation of the read-write conversion module 201 to be variable.

The local read-write unit 211 further includes a local write conversion circuit 2112, configured to transmit data of the global data line Gdat and the global complementary data line Gdat# to the local data line Ldat and the local complementary data line Ldat# in response to the local write control signal in the local read-write control signal.

The control module 202 outputs the local write control signal, and the control module 202 outputs the variable local write control signal in response to the read-write speed configuration signal to adjust a write speed of the local write conversion circuit 2112 to further make variable the speed of the local write operation of the read-write conversion module 201.

The local read-write unit 211 further includes a local amplifier 2113, connected between the local data line Ldat and the local complementary data line Ldat# and configured to amplify the data of the local data line Ldat and the data of the local complementary data line Ldat#.

The control module 202 outputs the variable local read control signal or the local write control signal to make variable an amplification speed of the local amplifier 2113, so that the speeds of the local read operation and the local write operation of the read-write conversion module 201 may be changed to a certain extent.

The local amplifier 2113 forms a circuit for amplifying the signal of the local data line Ldat and the signal of the local complementary data line Ldat#, and helps to accelerate the distinction between the level of the local data line Ldat and the level of the local complementary data line Ldat#, thereby increasing the data signal transmission speed and improving the data read-write speed. In addition, since the data signal of the local data line Ldat and the local complementary data line Ldat# are amplified, the local data line Ldat and the local complementary data line Ldat# have reduced demands on the drive capability of the sense amplifier in the memory. In this way, even if the area of the sense amplifier is gradually reduced, the sense amplifier has enough drive capability for the local data line Ldat and the local complementary data line Ldat# to satisfy the trend towards device miniaturization while simultaneously ensuring high electrical performance of the read-write conversion circuit, thereby improving the storage performance of the memory containing the read-write conversion circuit.

The global read-write unit 221 includes a sense amplifier 2211, a precharging unit 2212, and a write drive unit 2213. The sense amplifier 2211 may amplify the data signal of the global data line Gdat and the data signal of the global complementary data line Gdat#. The precharging unit 2212 may precharge the global data line Gdat and the global complementary data line Gdat#.

The control module 202 outputs the variable global read control signal to adjust the speed of the global read operation or the global write operation of the global read-write unit 221, such as adjusting the amplification speed of the sense amplifier 2211, the precharging speed of the precharging unit 2212, and the drive speed of the write drive unit 2213, to achieve the purpose of changing the global read-write operation of the read-write conversion module 201.

In the embodiment, as shown in FIG. 2, the read-write conversion circuit may further include a precharging circuit 204. The precharging circuit 204 is connected between the local data line Ldat and the local complementary data line Ldat#, and is configured to precharge the local data line Ldat and the local complementary data line Ldat# in response to a precharging control signal.

Figure 4:
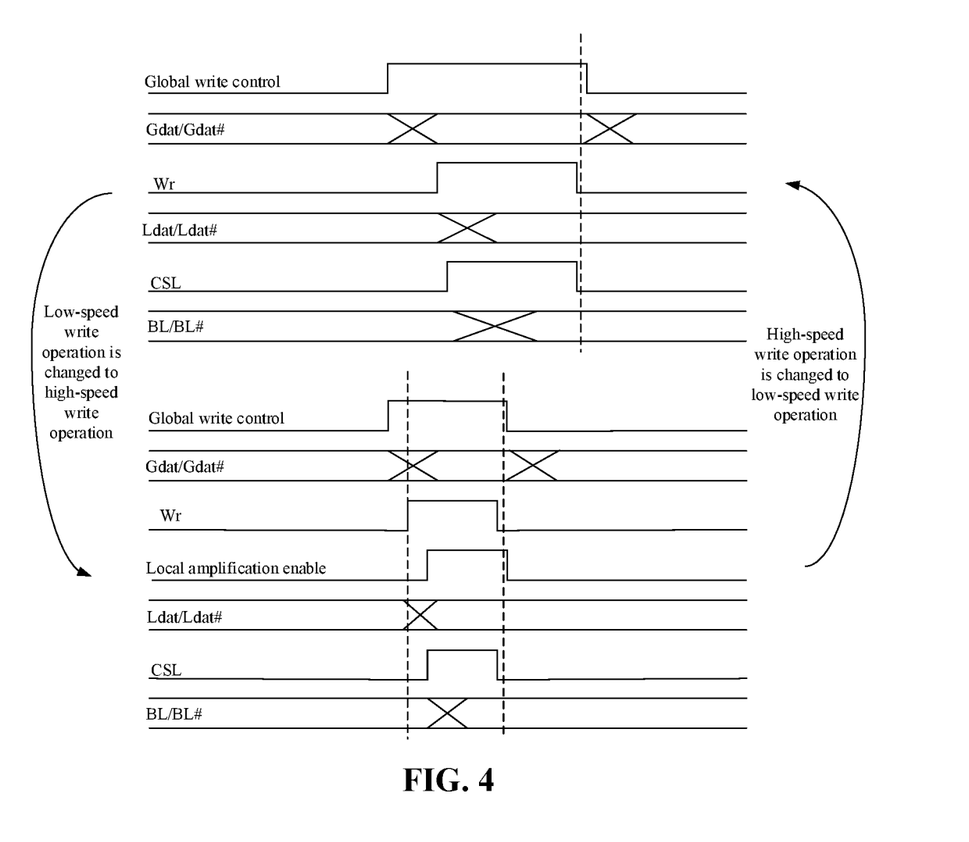
FIG. 4 is a sequence diagram of a read-write control signal corresponding to a high-speed write operation and low-speed write operation in a write operation of a read-write conversion circuit according to another embodiment of the disclosure.
Figure 5:
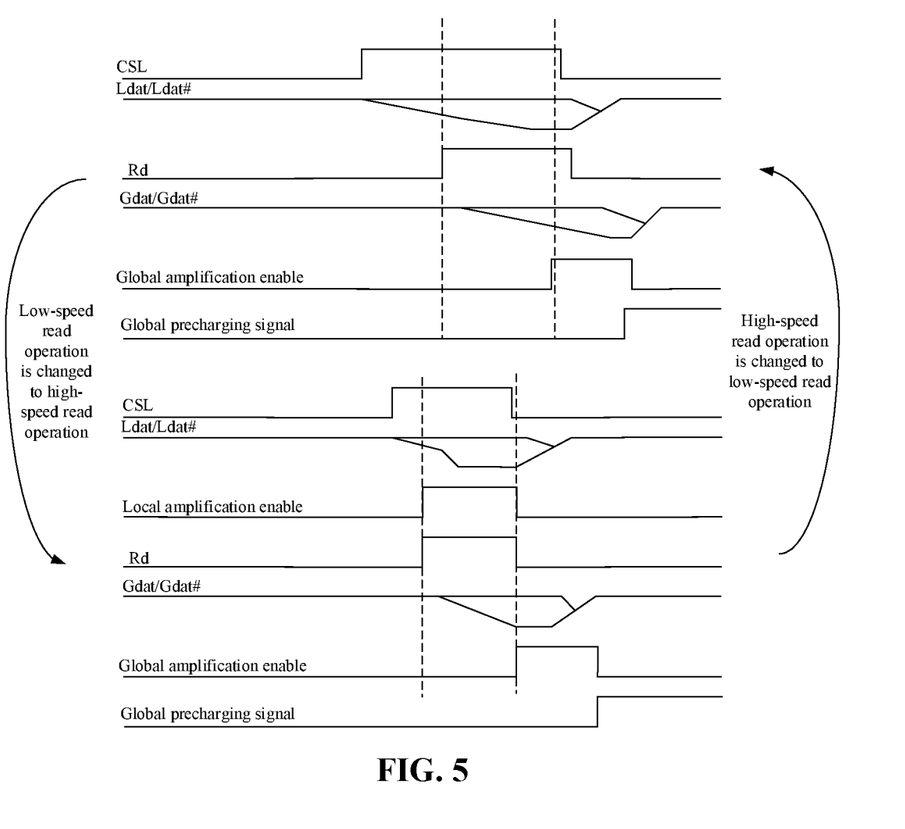
FIG. 5 is a sequence diagram of a read-write control signal corresponding to a high-speed read operation and low-speed read operation in a read operation of a read-write conversion circuit according to another embodiment of the disclosure.

FIG. 4 is a sequence diagram of a read-write control signal corresponding to a high-speed write operation and low-speed write operation in a write operation of the read-write conversion circuit according to the embodiment. FIG. 5 is a sequence diagram of a read-write control signal corresponding to a high-speed read operation and low-speed read operation in a read operation of the read-write conversion circuit according to the embodiment. FIG. 4 and FIG. 5 also show a bit line/complementary bit line signal (BL/BL#), a global data line/global complementary data line signal (Gdat/Gdat#), and a local data line/local complementary data line signal (Ldat/Ldat#). It can be understood that high speed and low speed are relative.

Referring to FIG. 4, when the write operation is performed, the read-write control signal includes the global write control signal, the column selection signal CSL, a local write signal Wr, and a local amplification enable. It can be understood that, when the low-speed write operation is performed, the level of local amplification enable may be 0, and thus the low-speed write operation corresponds to the sequence diagram that does not show the local amplification enable.

It is easily seen from FIG. 4 that: when the high-speed write operation is changed to the low-speed write operation, the rate of the read-write control signal decreases, data transmission rates of the global data line Gdat and the global complementary data line Gdat# decrease, and the data transmission rates of the local data line Ldat and the local complementary data line Ldat# decrease; and when the low-speed write operation is changed to the high-speed write operation, the rate of the read-write control signal increases, the data transmission rates of the global data line Gdat and the global complementary data line Gdat# increase, and the data transmission rates of the local data line Ldat and the local complementary data line Ldat# increase.

In addition, FIG. 4 only shows a sequence diagram of each read-write control signal in a single clock period. From the whole clock period, when the low-speed write operation is changed to the high-speed write operation, the rate of the write control signal in the corresponding read-write control signal increases, and when the high-speed write operation is changed to the low-speed write operation, the rate of the write control signal in the corresponding read-write control signal decreases.

Referring to FIG. 5, when the read operation is performed, the read-write control signal includes the column selection signal CSL, a local read signal Rd, a global amplification enable, a global precharging signal, and a local amplification enable. It can be understood that, when the low-speed read operation is performed, the level of local amplification enable may be 0, and thus the low-speed read operation corresponds to the sequence diagram that does not show the local amplification enable. It is easily seen from FIG. 5 that: when the high-speed read operation is changed to the low-speed read operation, the rate of the read-write control signal decreases, the data transmission rates of the local data line Ldat and the local complementary data line Ldat# decrease, and the data transmission rates of the global data line Gdat and the global complementary data line Gdat# decrease; and when the low-speed read operation is changed to the high-speed read operation, the rate of the read-write control signal increases, the data transmission rates of the local data line Ldat and the local complementary data line Ldat# increase, and the data transmission rates of the global data line Gdat and the global complementary data line Gdat# increase.

FIG. 5 only shows a sequence diagram of each read-write control signal in a single clock period. From the whole clock period, when the low-speed read operation is changed to the high-speed write operation, the rate of the read control signal in the corresponding read-write control signal increases, and when the high-speed read operation is changed to the low-speed read operation, the rate of the read control signal in the corresponding read-write control signal decreases.

It is to be noted that FIG. 4 and FIG. 5 only show some common read-write control signals influencing the speed of the read-write operation, and there may be other read-write control signals influencing the speed of the read-write operation in practical circuits according to different circuit designs.

A circuit structure of the local read-write unit in the read-write conversion circuit provided in the embodiment will specifically be described below in combination with the drawings.

Figure 6:
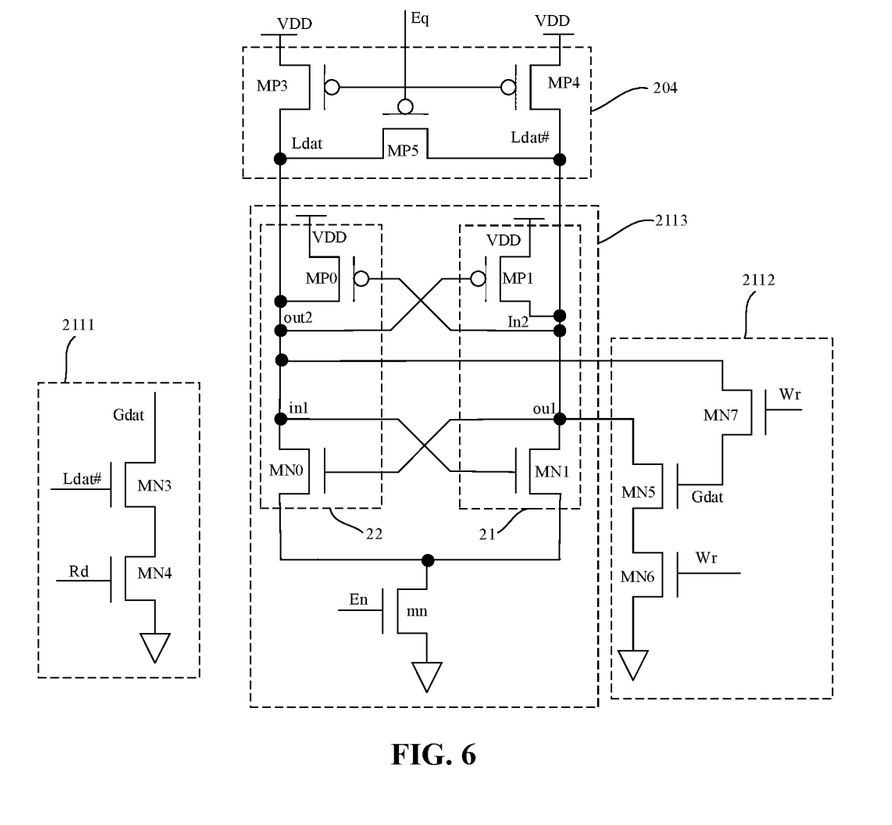
FIG. 6 is a schematic diagram of a circuit structure of a local read-write unit in a read-write conversion circuit according to another embodiment of the disclosure.
Figure 7:
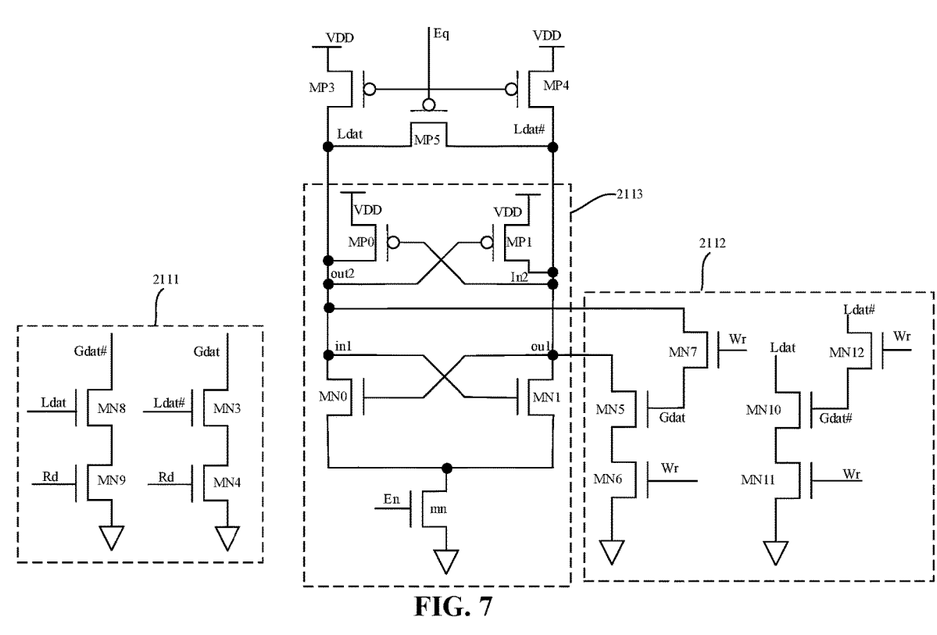
FIG. 7 is a schematic diagram of another circuit structure of a local read-write unit in a read-write conversion circuit according to another embodiment of the disclosure.

FIG. 6 is a schematic diagram of a circuit structure of the local read-write unit in the read-write conversion circuit according to the embodiment. FIG. 7 is a schematic diagram of another circuit structure of the local read-write unit in the read-write conversion circuit according to the embodiment.

Referring to FIG. 6, a single-end transmission manner is used for the global data line Gdat, that is, the read-write conversion circuit does not include the global complementary data line. The local read-write unit 211 includes the local read conversion circuit 2111, configured to transmit the data of the local data line Ldat and the local complementary data line Ldat# to the global data line Gdat, in response to the local read control signal in the local read-write control signal.

In the embodiment, the local read conversion circuit 2111 includes a third NMOS transistor MN3 and a fourth NMOS transistor MN4. The drain of the third NMOS transistor MN3 is connected with the global data line Gdat, the gate of the third NMOS transistor MN3 is connected with the local complementary data line Ldat#, and the source of the third NMOS transistor MN3 is connected with the drain of the fourth NMOS transistor MN4. The gate of the fourth NMOS transistor MN4 receives the local read signal Rd in the local read control signal, while the source is grounded.

It can be understood that the local read conversion circuit 2111 may also be another appropriate transformed circuit. For example, the gate of the fourth MNOS transistor is connected with the local complementary data line, and the gate of the third NMOS transistor receives the local read signal.

In another example, as shown in FIG. 7, a double-end transmission manner may also be used for the global data line Gdat, namely that the read-write conversion circuit includes the global data line Gdat and the global complementary data line Gdat#. During the read operation, the data signals of the global complementary data line Gdat# and the global data line Gdat are opposite in phase. Correspondingly, besides the abovementioned third NMOS transistor MN3 and fourth NMOS transistor MN4, the local read conversion circuit 2111 further includes an eighth NMOS transistor MN8 and a ninth NMOS transistor MN9. The drain of the eighth NMOS transistor MN8 is connected with the global complementary data line Gdat#, the gate of the eighth NMOS transistor MN8 is connected with the local data line Ldat, and the source of the eighth NMOS transistor MN8 is connected with the drain of the ninth MNOS transistor MN9. The gate of the ninth NMOS transistor MN9 receives the local read signal Rd, while the source is grounded.

The local read-write unit 211 includes the local write conversion circuit 2112, configured to transmit the data of the global data line Gdat to the local data line Ldat and the local complementary data line Ldat#, in response to the local write control signal in the local read-write control signal.

In the embodiment, the local write conversion circuit 2112 includes a fifth NMOS transistor MN5, a sixth NMOS transistor MN6, and a seventh NMOS transistor MN7. The drain of the fifth NMOS transistor MN5 is connected with the local complementary data line Ldat#, the gate of the fifth NMOS transistor MN5 is connected with the source of the seventh NMOS transistor MN7, and the source of the fifth NMOS transistor MN5 is connected with the drain of the sixth NMOS transistor MN6. The gate of the sixth NMOS transistor MN6 receives the local write signal Wr in the local write control signal, while the source is grounded. The drain of the seventh NMOS transistor MN7 is connected with the local data line Ldat, while the gate receives the local write signal Wr.

In another example, as shown in FIG. 7, the read-write conversion circuit 211 further includes the global complementary data line Gdat#. During the read operation, the data signals of the global complementary data line Gdat# and the global data line Gdat are opposite in phase. Besides the abovementioned fifth NMOS transistor MN5, sixth NMOS transistor MN6 and seventh NMOS transistor MN7, the local write conversion circuit 2112 further includes a tenth NMOS transistor MN10, an eleventh NMOS transistor MN11, and a twelfth NMOS transistor MN12. The drain of the tenth NMOS transistor MN10 is connected with the local data line Ldat, the gate of the tenth NMOS transistor MN10 is connected with the source of the twelfth NMOS transistor MN12 and the global complementary data line Gdat#, and the source of the tenth NMOS transistor MN10 is connected with the drain of the eleventh NMOS transistor MN11. The gate of the eleventh NMOS transistor MN11 receives the local write signal Wr, while the source is grounded. The drain of the twelfth NMOS transistor MN12 is connected with the local complementary data line Ldat#, while the gate receives the local write signal Wr.

The local amplifier 2113 includes: a first phase inverter 21, a first input end of the first phase inverter being electrically connected with the local data line Ldat, and a first output end out1 of the first phase inverter being electrically connected with the local complementary data line Ldat#; and a second phase inverter 22, a second input end in2 of the second phase inverter 22 being electrically connected with the second output end out2 of the first phase inverter 21 and the local complementary data line Ldat#, and a second output end out2 of the second phase inverter 22 being electrically connected with the first input end in1 of the first phase inverter 21 and the local data line Ldat.

Specifically, the first phase inverter 21 includes a first PMOS transistor MP1 and a first NMOS transistor MN1. The gate of the first PMOS transistor MP1 is electrically connected with the gate of the first NMOS transistor MN1 to serve as the first input end in1 of the first phase inverter, the source of the first PMOS transistor MP1 is connected with a power supply VDD, and the drain of the first PMOS transistor MP1 is connected with the drain of the first NMOS transistor MN1 to serve as the first output end out1 of the first phase inverter 21.

The second phase inverter 22 includes a zeroth PMOS transistor MP0 and a zeroth NMOS transistor MN0. A gate of the zeroth PMOS transistor MP0 is electrically connected with the gate of the zeroth NMOS transistor MN0 to serve as the second input end in2 of the second phase inverter 22, the source of the zeroth PMOS transistor MP0 is connected with the power supply VDD, and the drain of the zeroth PMOS transistor MP0 is connected with the drain of the zeroth NMOS transistor MN0 to serve as the second output end out2 of the second phase inverter 22.

The first PMOS transistor MP1, the first NMOS transistor MN1, the zeroth PMOS transistor MP0, and the zeroth NMOS transistor MN0 form the local amplifier 2113.

In some embodiments, the local amplifier 2113 further includes an enable NMOS transistor mn. The first phase inverter 21 and the second phase inverter 22 are also connected with a drain of the enable NMOS transistor mn. The drain of the enable NMOS transistor mn is grounded, while the gate receives the local enable signal En. Specifically, the source of the first NMOS transistor MN1 is connected with the source of the zeroth NMOS transistor MN0 and the drain of the sixth NMOS transistor MN6. In some other embodiments, the source of the first NMOS transistor MN1 is grounded, and the source of the zeroth NMOS transistor MN0 is grounded.

Due to the arrangement of the local amplifier 2113, the speed of transmitting the data from the bit line BL to the local data line Ldat is increased, the speed of transmitting the data from the complementary bit line BL# to the local complementary data line Ldat# is increased, and the drive requirement of the memory on the sense amplifier is reduced. Specifically, take the condition that the data of the bit line BL is at a high level and the data of the complementary data line BL# is at a low level as an example. Since the first input end in1 of the first phase inverter 21 is connected with the second output end out2 of the second phase inverter 22, and the first output end out1 of the first phase inverter 21 is connected with the second input end in2 of the second phase inverter 22, during transmission from the bit line BL and the complementary data line BL# to the local data line Ldat and the local complementary data line Ldat#, the arrangement of the local amplifier 2113 may pull the local complementary data line Ldat# with a lower voltage down to "0" more rapidly or pull the local data line Ldat with a higher voltage up to "1" more rapidly. Therefore, the speed to pull the local data line Ldat up is increased and the speed to pull the local complementary data line Ldat# down is also increased. Furthermore, the local data line Ldat and the local complementary data line Ldat# have reduced demands on the drive of the sense amplifier.

In addition, since the local data line Ldat and the local complementary data line Ldat# may reach high levels or low levels more rapidly, transmission from the local data line Ldat and the local complementary data line Ldat# to the global data line Gdat and the global complementary data line Gdat# may be implemented earlier. Therefore, when the data is read, the speed of data transmission from the local data line Ldat and the local complementary data line Ldat# to the global data line Gdat and the global complementary data line Gdat# is increased.

Correspondingly, during the write operation, the local amplifier 2113 may also amplify the local data line Ldat and the local complementary data line Ldat# to increase the speed of data transmission from the global data line Gdat and the global complementary data line Gdat# to the local data line Ldat and the local complementary data line Ldat#.

In the embodiment, the precharging circuit 204 includes a third PMOS transistor MP3, a fourth PMOS transistor MP4, and a fifth PMOS transistor MP5. The gate of the third PMOS transistor MP3, the gate of the fourth PMOS transistor MP4, and the gate of the fifth PMOS transistor MP5 receive the precharging control signal Eq. The source of the third PMOS transistor MP3 and the source of the fourth PMOS transistor MP4 are connected with the power supply VDD, the drain of the third PMOS transistor MP3 is electrically connected with the local data line Ldat, and the drain of the fourth PMOS transistor MP4 is electrically connected with the local complementary data line Ldat#. The fifth PMOS transistor MP5 is electrically connected with the local data line Ldat and the local complementary data line Ldat# in response to the precharging control signal Eq. The control module 202 outputs the read-write control signal in response to the read-write speed configuration signal to change the data read rate of the local read conversion circuit 2111 or the local write conversion circuit 2112, etc., thereby adjusting the read-write operation speed of the read-write conversion circuit.

The read-write conversion circuit provided in the embodiment may adjust not only the local read-write operation speed but also the global read-write operation speed, so that the convenience for adjusting the read-write operation speed of the read-write conversion circuit is further improved.

Correspondingly, an embodiment of the disclosure provides a memory, which includes the abovementioned read-write conversion circuit.

The memory may be a DRAM, a Static Random-Access Memory (SRAM), a Magneto resistive Random-Access Memory (MRAM), a Ferroelectric Random-Access Memory (RAM) (FeRAM), a Phase Change RAM (PCRAM), a NAND flash memory, a NOR flash memory, or another memory. It can be seen from the foregoing analysis that the memory provided in the embodiment has the advantage of variable data transmission speed, has a low demand on a drive capability of the sense amplifier, and is favorable for satisfying the trend towards device miniaturization.

Those of ordinary skill in the art can understand that each of the above-mentioned implementation modes is a specific embodiment for implementing the application, and that in practical applications, variations about the form and details can be made thereto without departing from the spirit and scope of the disclosure. Those skilled in the art may implement respective variations and modifications without departing from the spirit and scope of the disclosure, and thus the scope of protection of the disclosure should be subject to the scope defined by the claims.

What is claimed is:

1. A read-write conversion circuit, comprising:
a read-write conversion module, configured to perform a read-write operation in response to a read-write control signal; and
a control module, configured to output the read-write control signal that is variable in response to a read-write speed configuration signal, to control a speed of the read-write operation of the read-write conversion module to be variable,
wherein the read-write conversion circuit further comprises a local data line, a local complementary data line, and a global data line, wherein, during the read-write operation, data transmission is performed between each of the local data line and the local complementary data line, and the global data line, and data signals of the local data line and the local complementary data line are opposite in phase, wherein the read-write conversion module comprises a local read-write unit configured to perform a local read-write operation in response to a local read-write control signal in the read-write control signal, wherein the control module comprises a local control unit configured to output a variable local read-write control signal in response to a local read-write speed configuration signal in the read-write speed configuration signal to control a speed of the local read-write operation of the local read-write unit to be variable, wherein the local read-write unit comprises a local write conversion circuit, configured to transmit data of the global data line to the local data line and the local complementary data line in response to a local write control signal in the local read-write control signal; and the local write conversion circuit comprises:
a fifth NMOS transistor, a sixth NMOS transistor, and a seventh NMOS transistor; a drain of the fifth NMOS transistor is connected with the local complementary data line, a gate of the fifth NMOS transistor is connected with a source of the seventh NMOS transistor, and a source of the fifth NMOS transistor is connected with a drain of the sixth NMOS transistor; a gate of the sixth NMOS transistor is configured to receive a local write signal in the local write control signal, while a source is grounded; and a drain of the seventh NMOS transistor is connected with the local data line, and a gate of the seventh NMOS transistor is configured to receive the local write signal.

2. The read-write conversion circuit of claim 1, further comprising a speed configuration module, connected with the control module and configured to output the read-write speed configuration signal to the control module.

3. The read-write conversion circuit of claim 2, wherein the read-write control signal comprises a read control signal and a write control signal, and the read-write conversion module is configured to perform a read operation in response to the read control signal, and perform a write operation in response to the write control signal; and the speed configuration module comprises:
a read speed configuration unit, configured to output a read speed configuration signal in the read-write speed configuration signal to the control module to cause the control module to output the read control signal that is variable, in response to the read speed configuration signal, to control a speed of the read operation to be variable, and
a write speed configuration unit, configured to output a write speed configuration signal in the read-write speed configuration signal to the control module to cause the control module to output the write control signal that is variable, in response to the read speed configuration signal to control a speed of the write operation to be variable.

4. The read-write conversion circuit of claim 1, further comprising a local speed configuration module, connected with the local control unit and configured to output the local read-write speed configuration signal to the local control unit.

5. The read-write conversion circuit of claim 1, further comprising a sense amplifier, connected with the local read-write unit through the local data line and the local complementary data line, and configured to sense a voltage of a bit line.

6. The read-write conversion circuit of claim 5, wherein a same local read-write unit is connected with multiple sense amplifiers, through the local data line and the local complementary data line.

7. The read-write conversion circuit of claim 5, wherein a write data path comprises: from the local read-write unit to the sense amplifier via the local data line and the local complementary data line, and then to the bit line via the sense amplifier; and a read data path comprises: from the bit line to the local data line and the local complementary data line via the sense amplifier, and then to the local read-write unit via the local data line and the local complementary data line.

8. The read-write conversion circuit of claim 1, wherein the read-write conversion module comprises a global read-write unit, configured to perform a global read-write operation in response to a global read-write control signal in the read-write control signal; and the control module comprises a global control unit, configured to output the global read-write control signal that is variable, in response to a global read-write speed configuration signal in the read-write speed configuration signal, to control a speed of the global read-write operation of the global read-write unit to be variable.

9. The read-write conversion circuit of claim 8, further comprising a global speed configuration module, connected with the global control unit and configured to output the global read-write speed configuration signal to the global control unit.

10. The read-write conversion circuit of claim 1, wherein the local read-write unit comprises a local amplifier, connected between the local data line and the local complementary data line and configured to amplify data of the local data line and data of the local complementary data line.

11. The read-write conversion circuit of claim 10, wherein the local amplifier comprises: a first phase inverter, a first input end of the first phase inverter being electrically connected with the local data line, and a first output end of the first phase inverter being electrically connected with the local complementary data line; and a second phase inverter, a second input end of the second phase inverter being electrically connected with the first output end of the first phase inverter and the local complementary data line, and a second output end of the second phase inverter being electrically connected with the first input end of the first phase inverter and the local data line.

12. The read-write conversion circuit of claim 11, wherein the first phase inverter comprises a first P-channel Metal Oxide Semiconductor (PMOS) transistor and a first N-channel Metal Oxide Semiconductor (NMOS) transistor, a gate of the first PMOS transistor is connected with a gate of the first NMOS transistor to serve as the first input end of the first phase inverter, a source of the first PMOS transistor is connected with a power supply, and a drain of the first PMOS transistor is connected with a drain of the first NMOS transistor to serve as the first output end of the first phase inverter;

the second phase inverter comprises a zeroth PMOS transistor and a zeroth NMOS transistor; and a gate of the zeroth PMOS transistor is connected with a gate of the zeroth NMOS transistor to serve as the second input end of the second phase inverter, a source of the zeroth PMOS transistor is connected with the power supply, and a drain of the zeroth PMOS transistor is connected with a drain of the zeroth NMOS transistor to serve as the second output end of the second phase inverter.

13. The read-write conversion circuit of claim 1, wherein the local read-write unit comprises a local read conversion circuit, configured to transmit the data of the local data line and the local complementary data line to the global data line in response to a local read control signal in the local read-write control signal; and the local read conversion circuit comprises:

a third NMOS transistor and a fourth NMOS transistor;

wherein a drain of the third NMOS transistor is connected with the global data line, a gate of the third NMOS transistor is connected with the local complementary data line, and a source of the third NMOS transistor is connected with a drain of the fourth NMOS transistor; and a gate of the fourth NMOS transistor receives a local read signal in the local read control signal, while a source is grounded.

14. The read-write conversion circuit of claim 13, further comprising a global complementary data line, wherein during the read operation, data signals of the global complementary data line and the global data line are opposite in phase;

the local read conversion circuit further comprises an eighth NMOS transistor and a ninth NMOS transistor;

a drain of the eighth NMOS transistor is connected with the global complementary data line, a gate of the eighth NMOS transistor is connected with the local data line, and a source of the eighth NMOS transistor is connected with a drain of the ninth NMOS transistor; and a gate of the ninth NMOS transistor receives the local read signal, while a source is grounded.

15. The read-write conversion circuit of claim 1, further comprising a global complementary data line, wherein during the read-write operation, data signals of the global complementary data line and the global data line are opposite in phase;

the local write conversion circuit further comprises a tenth NMOS transistor, an eleventh NMOS transistor, and a twelfth NMOS transistor; a drain of the tenth NMOS transistor is connected with the local data line, a gate of the tenth NMOS transistor is connected with a source of the twelfth NMOS transistor and the global complementary data line, and a source of the tenth NMOS transistor is connected with a drain of the eleventh NMOS transistor;

a gate of the eleventh NMOS transistor receives the local write signal, and a source of the eleventh NMOS transistor is grounded; and a drain of the twelfth NMOS transistor is connected with the local complementary data line, and a gate of the twelfth NMOS transistor is configured to receive the local write signal.

16. The read-write conversion circuit of claim 1, wherein the local read-write unit further comprises a precharging circuit, connected between the local data line and the local complementary data line and configured to precharge the local data line and the local complementary data line in response to a precharging control signal.

17. A memory, comprising the read-write conversion circuit of claim 1.

18. The read-write conversion circuit of claim 1, wherein the control module is configured to output the variable read-write control signal in response to the read-write speed configuration signal to control the speed of the read-write operation of the read-write conversion module in a Dynamic Random Access Memory (DRAM) to be variable.

19. The read-write conversion circuit of claim 1, further comprising a global complementary data line.

20. The read-write conversion circuit of claim 19, wherein a read data path of the read-write conversion circuit goes from a bit line and a complementary bit line to the local data line and the local complementary data line via a sense amplifier, then to the local read-write unit via the local data line and the local complementary data line, then to the global data line and the global complementary data line via the local read-write unit, and finally to a global read-write unit via the global data line and the global complementary data line.

* * * * *